(12) United States Patent
Bruski et al.

(10) Patent No.: US 7,778,013 B2
(45) Date of Patent: Aug. 17, 2010

(54) ARC RESISTANT BAFFLE FOR REDUCING ARC-FLASH ENERGY IN AN ELECTRICAL ENCLOSURE

(75) Inventors: Gary P. Bruski, Germantown, WI (US); Chester Malkowski, Jr., Franklin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 430 days.

(21) Appl. No.: 11/261,893

(22) Filed: Oct. 28, 2005

(65) Prior Publication Data

US 2007/0097604 A1 May 3, 2007

(51) Int. Cl.
*H05K 7/20* (2006.01)
*H02B 7/00* (2006.01)

(52) U.S. Cl. ............ 361/605; 361/676; 361/678; 361/690

(58) Field of Classification Search ............ 361/605, 361/676, 678, 690
See application file for complete search history.

(56) References Cited

U.S. PATENT DOCUMENTS

| | | | | |
|---|---|---|---|---|
| 2,824,939 A * | 2/1958 | Claybourn et al. | ......... | 200/289 |
| 4,118,755 A * | 10/1978 | Davies et al. | ........... | 361/678 |
| 4,464,703 A * | 8/1984 | Davies et al. | ........... | 361/614 |
| 4,528,614 A * | 7/1985 | Shariff et al. | ........... | 361/678 |
| 5,111,362 A * | 5/1992 | Flamm et al. | ........... | 361/736 |
| 5,449,319 A * | 9/1995 | Dushane et al. | ........... | 454/319 |
| 5,574,624 A * | 11/1996 | Rennie et al. | ........... | 361/676 |
| 5,892,195 A * | 4/1999 | Aufermann et al. | ...... | 218/157 |
| 6,241,603 B1 * | 6/2001 | Watson | ................ | 454/284 |
| 2002/0043217 A1 * | 4/2002 | Rivard | ................... | 119/419 |
| 2003/0035264 A1 * | 2/2003 | Hartel et al. | ........... | 361/678 |
| 2003/0037953 A1 * | 2/2003 | Sarkinen et al. | ........ | 174/72 R |
| 2003/0156385 A1 * | 8/2003 | Askeland et al. | ......... | 361/687 |
| 2004/0114289 A1 * | 6/2004 | Eiselt et al. | ............... | 361/62 |
| 2004/0166797 A1 * | 8/2004 | Thrasher et al. | ......... | 454/290 |
| 2005/0186899 A1 * | 8/2005 | Palmer et al. | ........... | 454/201 |
| 2005/0284167 A1 * | 12/2005 | Morgan et al. | ............ | 62/272 |
| 2006/0152889 A1 * | 7/2006 | Dalis | ..................... | 361/605 |
| 2006/0172685 A1 * | 8/2006 | O'Brien | ................. | 454/184 |
| 2006/0289127 A1 * | 12/2006 | Fowler | ................... | 160/180 |

FOREIGN PATENT DOCUMENTS

DE 29606617 U1 * 9/1996

* cited by examiner

*Primary Examiner*—Anatoly Vortman
(74) *Attorney, Agent, or Firm*—Fletcher Yoder LLP; Alexander R. Kuszewski; John M. Miller

(57) ABSTRACT

A venting system is described for use with electrical enclosures in which hot gasses may be generated by certain types of fault. The venting assembly may be mounted to a surface of the enclosure, such as adjacent to an aperture formed in the enclosure door. The vent assembly includes a series of louvers that divert all gasses flowing from the enclosure and provide no direct path for gas. The vent assembly thus provides unimpeded flow of hot gasses during a fault event to divert and cool the gasses before exiting the enclosure. The vent assembly may be configured as a cartridge-type insert mounted either inside or outside the enclosure.

17 Claims, 5 Drawing Sheets

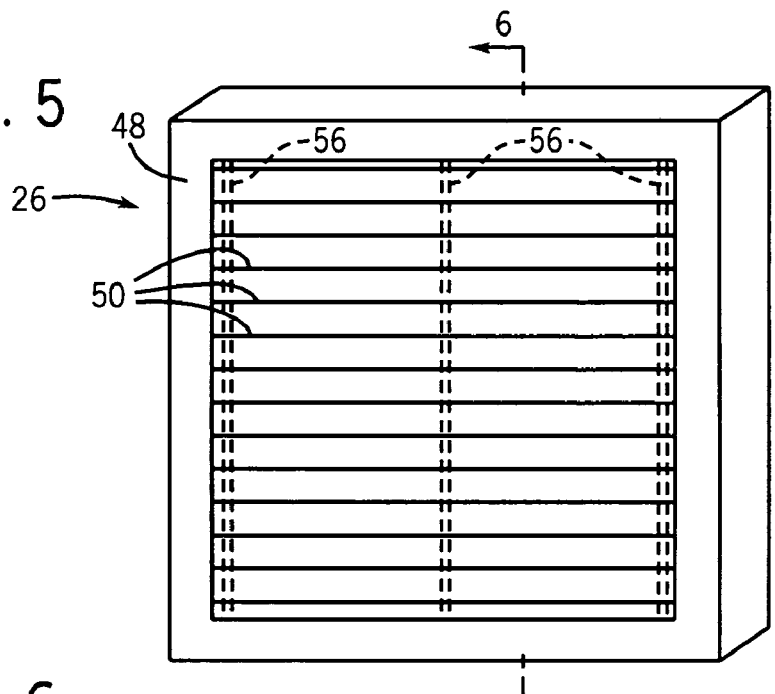
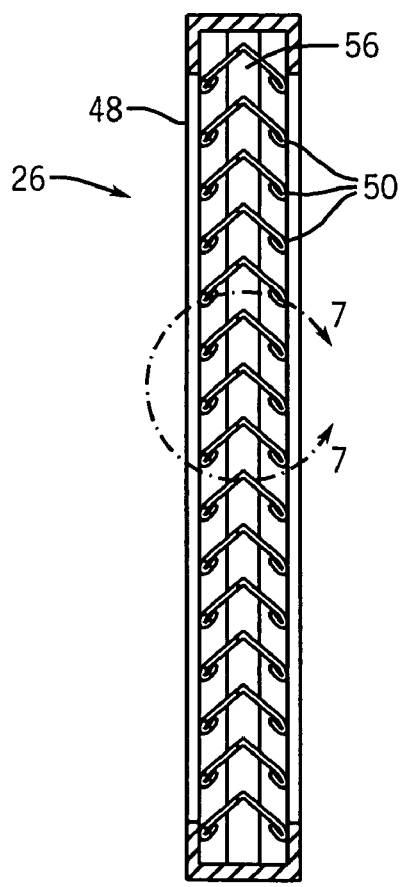
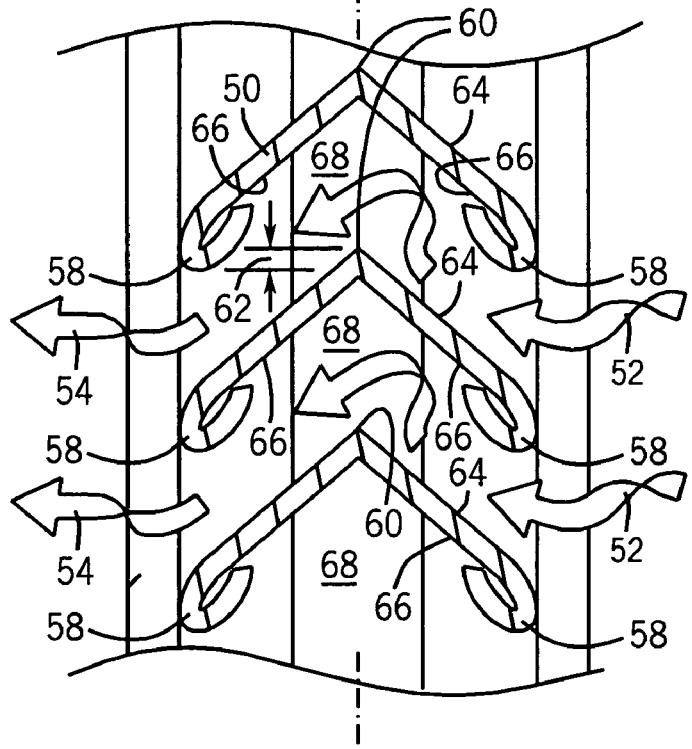

ARC RESISTANT BAFFLE FOR REDUCING ARC-FLASH ENERGY IN AN ELECTRICAL ENCLOSURE

BACKGROUND

The present invention relates generally to the field of electrical enclosures. More particularly, the invention relates to a novel venting arrangement for an electrical enclosure that permits the escape and cooling of heated gasses resulting from faults and malfunctions within the enclosure.

A wide range of applications exist for electrical enclosures and cabinets. Such enclosures include both small and large individual units, such as for housing contactors and other switchgear. Larger enclosures are also common, such as for housing various power electronics equipment, control circuits, motor drives, and so forth. For instance, in industry it is common to find large enclosures divided into bays or segments for single and three-phase switchgear, motor controllers, programmable logic controllers, data and power network interfaces, and so forth.

A particular challenge in the design and operation of electrical components in enclosures relates to channeling and cooling of hot gasses that can result from malfunction of the electrical components. Relatively low level electronic signals exhibit fault characteristics that do not produce volumes of hot gasses. However, in applications where higher voltage electrical power is routed to devices, particularly through fuses, disconnects, contactors, switchgear, controllers and so forth, certain types of fault can produce arcs that can heat and even vaporize neighboring components. While development of protective circuitry has focused on interrupting such faults extremely quickly, even several cycles of alternating current can suffice to vaporize wires, insulation, and even component housings. Such faults result in large volumes of hot gas that expand and must be channeled or vented within or from the enclosure.

Enclosure venting techniques have been developed that can route hot gasses from an enclosure during a fault. Certain of these include large air conduits that can lead gasses away from the enclosure, such as to an external environment outside of a factory. Enclosures have also been designed that allow a door or other cover to be displaced (e.g., blown partially out) by hot gasses to permit the gasses to escape. Such techniques are either quite expensive, or fairly destructive to the enclosure, or both. In many cases, it is preferred to vent hot gasses as quickly as possible, and to cool the gasses regardless of the long term effects on the electrical components themselves, many of which may require replacement after the event.

A range of applications exist for vented electrical enclosures that simply cannot use these approaches to arc flash gas management. In vented enclosures, a vent is commonly provided for the exchange of air between the interior and the exterior of the enclosure with many such applications calling for forced air venting through the use of fans. Vented enclosures have faced a difficulty in dealing with arc flash faults, however, due to their inability to properly vent and cool gasses during such faults. Accordingly, vented enclosures capable of meeting industry standards for arc flash testing are not generally available.

There is a need, therefore, for improved designs for enclosures and improved techniques for venting gasses from such enclosures upon occurrence of a fault condition. There is a particular need for designs that can meet stringent industry standards for gas temperatures around the enclosure, while permitting conventional venting of the enclosure.

BRIEF DESCRIPTION

The invention provides a novel approach to hot gas venting from electrical enclosures designed to respond to such needs. The invention may be employed with a range of enclosure types, but is particularly well-suited to conventional sheet metal enclosures. The venting technique may be employed on relatively small independent enclosures, but is also well-suited for larger, and even compartmentalized enclosures. Similarly, the venting technique may be employed where either natural air circulation or forced air circulation is envisaged, including in applications where a fan is employed to expel air from the enclosure during operation.

The technique makes use of a vent assembly that may be affixed to the enclosure as a cartridge-type unit. Where desired, the vent assembly may be removable from the enclosure. The vent assembly diverts hot gasses that form within the enclosure to an outside environment, such as to a space in front of the enclosure by passage through the enclosure door. The gasses are completely diverted by louvers of other diverting structures within the vent assembly such that no gasses pass directly from the enclosure through the vent assembly. All gasses are thus diverted by surfaces of the vent assembly. The vent assembly both directs the gas from the enclosure and cools the gas as it passes through the vent assembly. While all gasses are diverted through the vent assembly, the vent assembly provides an unimpeded path between the louvers for the flow of gas.

DRAWINGS

These and other features, aspects, and advantages of the present invention will become better understood when the following detailed description is read with reference to the accompanying drawings in which like characters represent like parts throughout the drawings, wherein:

FIG. 5 is a perspective view of an exemplary vent assembly cartridge for use in the applications illustrated in the previous figures;

FIG. 6 is a sectional view through the cartridge of FIG. 5 illustrating louvers positioned therein for diverting hot gas flow;

FIG. 7 is a detailed view of a series of louvers of the vent assembly, illustrating a manner in which overlapping edges of the vent assembly provide for gas diversion and flow.

DETAILED DESCRIPTION

Figure 1:
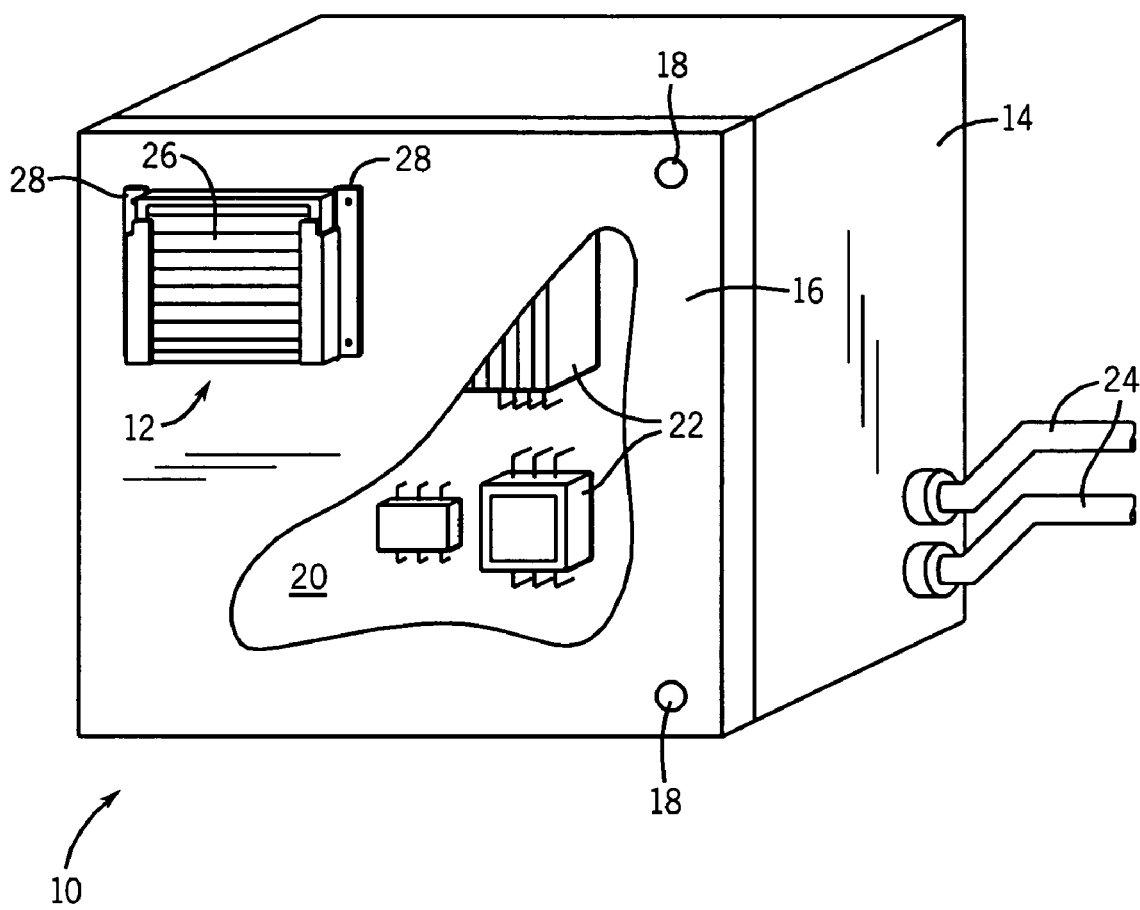
FIG. 1 is a perspective view of an exemplary enclosure on which a vent assembly is provided in accordance with aspects of the present technique.

Turning now to the drawings, and referring first to FIG. 1, an enclosure 10 is illustrated in which a hot gas vent 12 is provided. The enclosure 10 may be any suitable type of electrical enclosure, such as an unsealed conventional sheet metal enclosure, but will typically be an enclosure in which normal venting is desired. The enclosure is formed of a shell 14 having an opening over which a door 16 may be closed. The door is typically hinged to the shell, and latches 18 permit the door to be secured in the closed position. When closed, the door 16 encloses with the shell 14 an interior volume 20 in which various electronic and electrical components 22 may be disposed. In a typical application, the components are mounted on one or more panels, and electrical wiring is terminated to the various components in accordance with the component and circuit designs. In presently contemplated embodiments, the components may be used to route single and three-phase alternating current power from a source to various applications, such as motor drives, and other loads. Various conduits, as indicated by reference numeral 24, may be used to channel control power, application power, and data signals to and from the various components within the enclosure.

The hot gas vent 12 may be disposed on any surface of the enclosure 10. In the illustrated embodiment, the hot gas vent 12 is positioned in a corner of the front door panel 16. It should also be noted that various sizes and configurations of hot gas vents may be envisaged, and that described herein is merely intended to be an exemplary arrangement. The hot gas vent 12 generally includes a vent assembly 26 held in place on the door by mounting brackets 28. It may also be noted that the vent assembly 26 may be located on an inside of the enclosure, or on an outer surface, or both. Similarly, the vent assembly described below, including the mounting brackets 28, may be designed for optional mounting on standard enclosures where such venting of hot gasses is desired, or even for retrofitting existing enclosures and circuitry.

Figure 2:
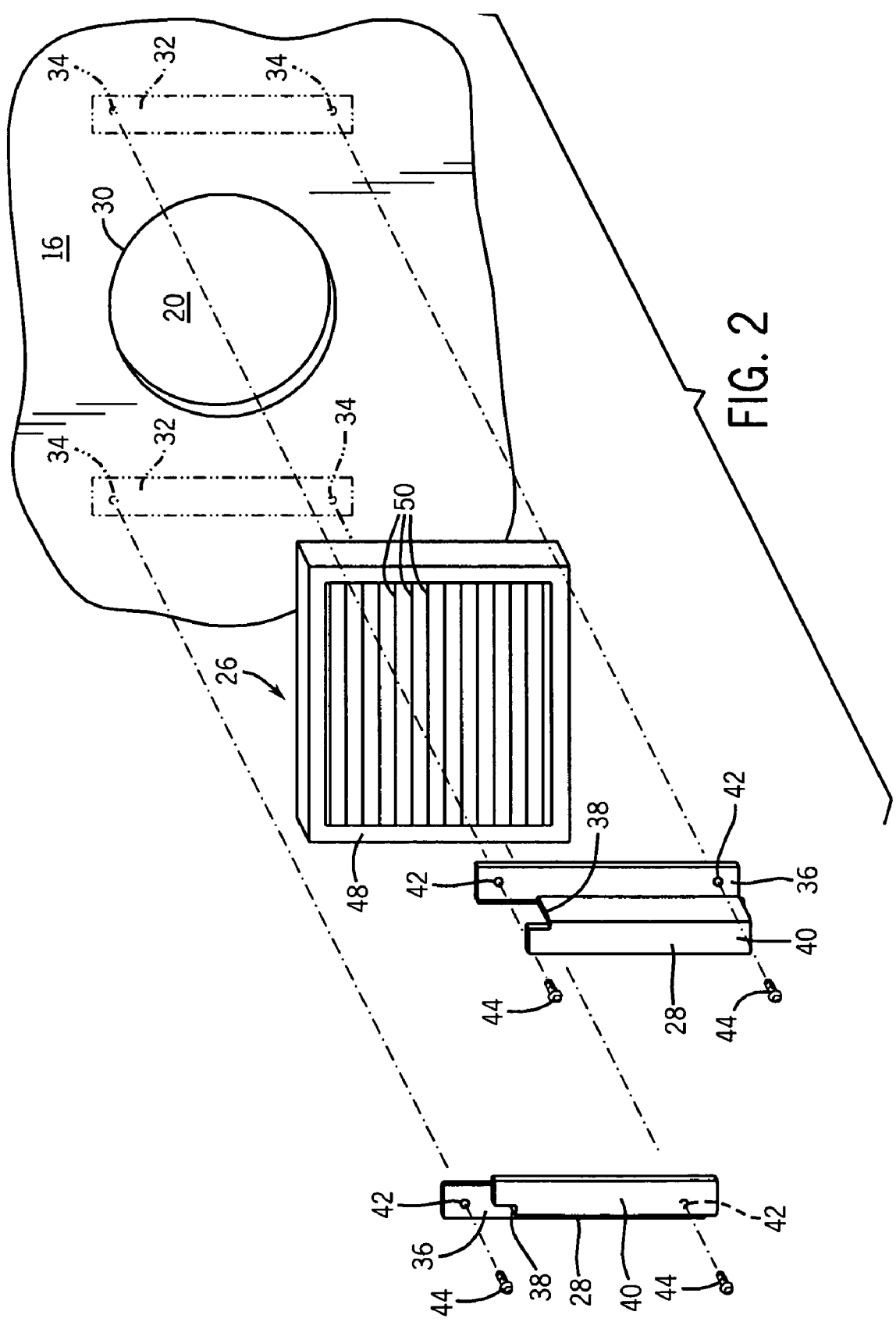
FIG. 2 is an exploded perspective view of an exemplary vent assembly and mounting hardware for securing the assembly adjacent to an aperture in an enclosure.

As shown in FIG. 2, the vent assembly 26 and mounting brackets 28 are generally positioned over an aperture 30 formed in the enclosure. The aperture 30 permits communication of gasses from the interior volume 20 of the enclosure to the surrounding environment. The brackets 28 that secure the vent assembly 26 to the enclosure door are positioned at locations 32 on either side of the aperture. The aperture and mounting brackets, may, of course, have different configurations, shapes, positions, and so forth. In the illustrated embodiment, at each location 32, a pair of holes 34 are formed for securing the brackets to the enclosure as described below.

Each bracket 28 includes a flange 36 configured to bear against the front of the enclosure, as well as a side 38 and a retaining flange 40. The side 38 accommodates the thickness of the vent assembly 26, while the retaining flanges 40 serve to hold the vent assembly over the aperture 30 in the enclosure. Holes 42 are formed in the flanges 36 for receiving rivets 44 that also penetrate through the holes 34 formed in the enclosure door. The rivets secure the brackets in place and resist forces resulting from the passage of hot gasses through the vent assembly as described below.

The vent assembly 26 itself may be formed as a cartridge-type structure that can be slid into the space between the flanges 40 of the brackets and the surface of the enclosure. In the illustrated embodiment, the vent assembly 26 includes a frame 48 within which louvers 50 are secured. Such structures may be obtained commercially, such as from Bolt-switch, Inc., of Crystal Lake, Ill.

Figure 3:
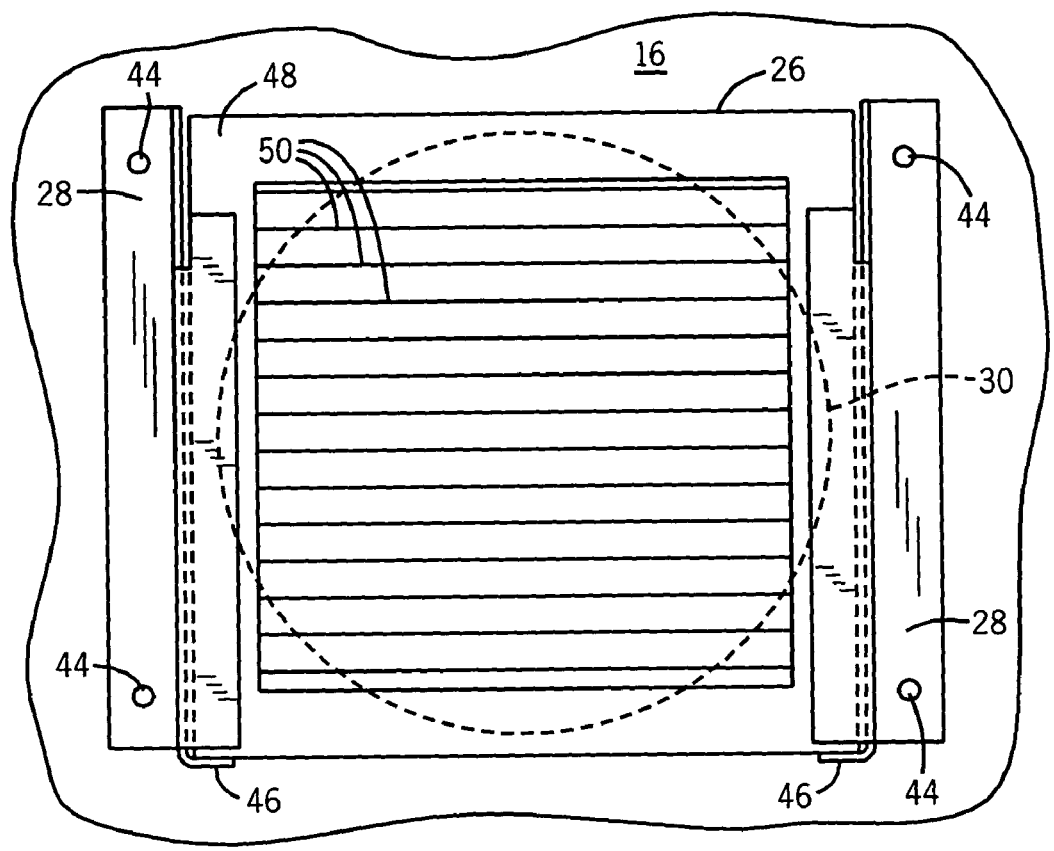
FIG. 3 is an elevational view of the assembly of FIG. 2 following assembly.

FIG. 3 is an elevational view of the foregoing structure following assembly. As can be seen from FIG. 3, the vent assembly 26 is housed between the front surface of the enclosure door 16 and the brackets 28. Lower support extensions 46 of the brackets hold the vent assembly 26 vertically. The brackets preferably maintain a slight pressure on the vent assembly 26 to hold it snuggly against the enclosure surface. As noted above, such vent assemblies can be provided on any surface of the enclosure, including side surfaces, bottom surfaces, top surfaces and rear surfaces.

Figure 4:
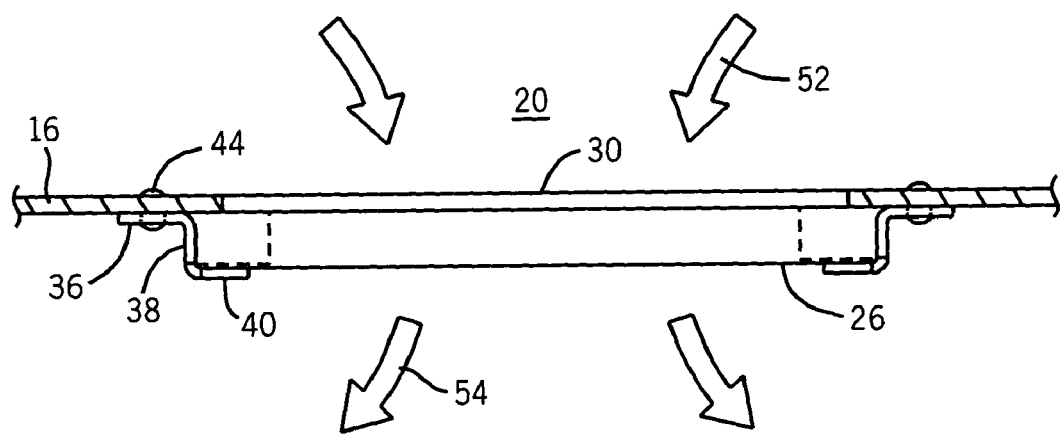
FIG. 4 is a plan view sectioned through the enclosure door shown in FIG. 3 illustrating various components of the vent assembly.

FIG. 4 is a sectional view through a portion of a front panel of the enclosure looking down onto the assembled vent. As illustrated, the vent assembly 26 is positioned in front of the aperture 30 through the enclosure wall. Rivets 44 hold the brackets of the assembly snuggly in place over the aperture. In operation, when gasses are heated by a short or other malfunction within the enclosure, such gasses may enter the vent assembly as indicated at reference numeral 52, and exit the vent assembly after being diverted and cooled by the vent assembly, as indicated at reference numeral 54.

In a present configuration, as best shown in FIGS. 5 and 6, the vent assembly is a cartridge-type replaceable subassembly that can be fitted into the brackets on the enclosure as described above. As shown in FIGS. 5 and 6, the frame 48 generally surrounds an opening in the vent assembly in which a series of louvers 50 or other diverting surfaces are positioned. In a present embodiment, the entire structure is made of aluminum which is believed to assist in cooling the gasses as they exit the enclosure. Vertical supports 56 aid in holding the louvers in place within the frame 48. In the sectional view of FIG. 6, it can be seen that in the present embodiment the louvers are inverted V or chevron-shaped structures that provide a fully open path therebetween, but that serve to divert all gasses exiting the structure. That is, the louvers overlap with one another such that there is no direct line-of-sight between the outer environment and the inner volume of the enclosure.

These louvers serve to divert and cool gasses exiting the enclosure as best illustrated in FIG. 7. As shown in FIG. 7, each louver has a lower edge 58 and an upper edge 60. In the illustrated embodiment, owing to the chevron-shape of the louvers, two such lower edges are provided and the upper edge 60 is the apex of the inverted V. As will be appreciated by those skilled in the art, other configurations may be suitable for the vent assembly, including angled plates, plates having more than two inclined surfaces (e.g., Z-shaped) and so forth. The lower edge 58 of each louver overlaps with the upper edge 60 of an adjacent louver by a predetermined overlap 62 to interrupt any direct path of gas between the interior of the enclosure and the outer environment. Thus, inclined upper surfaces 64 and inclined lower surfaces 66 are impinged by exiting gasses, diverting the gasses through the louvers and cooling the gasses as they exit the enclosure. However, between the louvers, a free-flow path 68 is defined which is generally unimpeded and unencumbered. Thus, little or no pressure drop is experienced by the gasses, depending upon the velocity of the gasses through the vent assembly 26.

Figure 8:
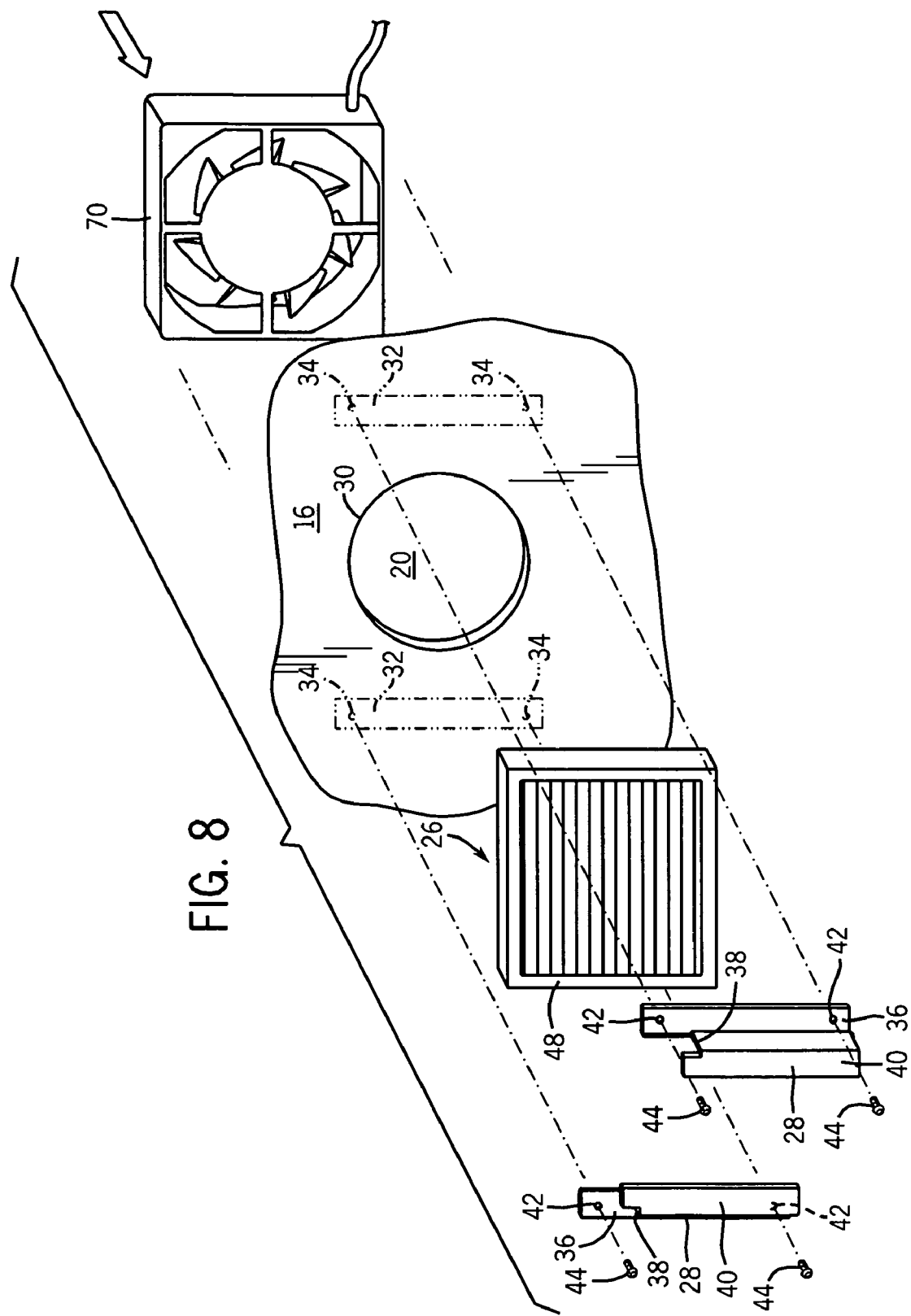
FIG. 8 is an exploded perspective view of an alternative configuration in which a driven fan is used to force air through the vent assembly shown in the foregoing figures.

As noted above, the foregoing venting structure and technique may be employed with natural flow through the vent assembly, as well as with arrangements. FIG. 8 illustrates the system described above but with the addition of a forced air fan 70. The fan may be driven by any conventional means, such as an integral motor (not shown) that forces air from the enclosure to the environment during normal operation. It is been found that even during arc faults, such fans do not impede the proper function of the vent assembly both in permitting the free escape of hot gasses, and cooling.

The foregoing venting arrangement may be used in conjunction with other venting systems to meet stringent requirements of existing venting standards. For example, in a present embodiment of the type described above, arcfault or arcflash tests were performed and the structure offered compliance with ANSI standard PC37.20.7. As will by those skilled in the art, such standards provide for limiting the energy of exiting gasses within a set distance from the enclosure.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An electrical enclosure venting system comprising:
    an enclosure having at least one vertically oriented door directly between an interior volume of the enclosure and an external environment, the enclosure being configured to house electrical components capable of generating hot gases during an arc-fault, wherein the vertically oriented door is substantially perpendicular to sidewalls of the enclosure; and
    a baffle disposed over an opening in the vertically oriented door directly into the interior volume of the enclosure in which the electrical components are disposed, the baffle including gas deflecting surfaces configured to deflect the hot gases from the interior volume of the enclosure directly to the external environment via the opening in the vertically oriented door and to cool the hot gases during their transport from the interior volume of the enclosure to the external environment, wherein the baffle includes a plurality of parallel deflecting elements in overlapping arrangement, wherein the deflecting elements interrupt all direct transport paths of hot gases between the interior of the enclosure and the external environment, and wherein the deflecting elements comprise inverted V or chevron shaped structures.

2. The system of claim 1, wherein the deflecting elements are separated by unimpeded air passages extending substantially along their entire length.

3. The system of claim 1, wherein the baffle is supported on an external surface of the vertically oriented door.

4. The system of claim 3, wherein the vertically oriented door comprises an external support bracket and the baffle is formed as a removable cartridge element supported on the vertically oriented door by the support bracket.

5. The system of claim 4, wherein the cartridge element is configured to be removably slid into the support bracket.

6. The system of claim 1, wherein the baffle cools the hot gases at least to a temperature sufficient to conform to ANSI standard PC37.20.7.

7. The system of claim 1, wherein the baffle is made of aluminum.

8. The system of claim 1, further comprising a fan disposed adjacent to the opening on the interior of the enclosure for forcing a flow of venting air from the enclosure during operation.

9. An electrical enclosure venting system comprising:
    an enclosure having at least one vertically oriented door;
    a plurality of electrical components supported in the enclosure and directly accessible via the vertically oriented door, the components capable of generating hot gases during an arc-fault, wherein the vertically oriented door is substantially perpendicular to sidewalls of the enclosure; and
    a baffle disposed over an opening in the vertically oriented door directly into an interior volume in which the electrical components are disposed in the enclosure, the baffle including gas deflecting surfaces configured to deflect the hot gases from an interior of the enclosure directly to an external environment via the opening in the vertically oriented door and to cool the hot gases during their transport from the interior of the enclosure to the external environment, wherein the baffle includes a plurality of parallel deflecting elements in overlapping arrangement, the deflecting elements interrupt all direct transport paths of hot gases between the interior of the enclosure and the external environment, and wherein the deflecting elements comprise inverted V or chevron shaped structures.

10. The system of claim 9, wherein the electrical components include switchgear configured to convey three phase power of at least 480 vac to a load.

11. The system of claim 9, wherein the deflecting elements are separated by unimpeded air passages extending substantially along their entire length.

12. The system of claim 9, wherein the baffle cools the hot gases at least to a temperature sufficient to conform to ANSI standard PC37.20.7.

13. The system of claim 9, further comprising a fan disposed adjacent to the opening on the interior of the enclosure for forcing a flow of venting air from the enclosure during operation.

14. A method for ventilating an electrical enclosure comprising:
    deflecting and cooling gases heated by an arc-fault of electrical components within the enclosure through a baffle disposed over an opening in a vertically oriented door directly into an interior volume in which the electrical components are disposed in the enclosure such that the deflected and cooled gases flow from the interior volume directly to an external environment, wherein the vertically oriented door is substantially perpendicular to sidewalls of the enclosure, wherein all of the gases are deflected by deflecting elements of the baffle, and wherein the deflecting elements comprise inverted V or chevron shaped structures.

15. The method of claim 14, wherein the baffle cools the heated gases at least to a temperature sufficient to conform to ANSI standard PC37.20.7.

16. The method of claim 14, further comprising forcing a stream of air through the baffle via a fan disposed in the enclosure.

17. The method of claim 14, further comprising permitting movement of the vertically oriented door of the enclosure to aid in venting the heated gases from the interior of the enclosure.

* * * * *